United States Patent [19]
Sugasawara et al.

[11] Patent Number: 6,013,533
[45] Date of Patent: Jan. 11, 2000

[54] REAL TIME QUIESCENT CURRENT TEST LIMIT METHODOLOGY

[75] Inventors: Emery Osamu Sugasawara, Pleasanton; Scott Franklin Keller, Foster City, both of Calif.

[73] Assignee: LSI Logic Corporation, Milpitas, Calif.

[21] Appl. No.: 08/924,187

[22] Filed: Sep. 5, 1997

[51] Int. Cl.[7] .................................................. H01L 21/00
[52] U.S. Cl. ............................................... 438/10; 438/17
[58] Field of Search ................................. 438/5, 10, 14, 438/15, 17

[56] References Cited

U.S. PATENT DOCUMENTS

| | | | |
|---|---|---|---|
| 4,243,937 | 1/1981 | Multani et al. .......................... | 324/765 |
| 5,286,656 | 2/1994 | Keown et al. ............................. | 437/7 |
| 5,841,293 | 11/1998 | Leas .......................................... | 324/765 |

*Primary Examiner*—Brian Dutton

[57] ABSTRACT

A method of sorting dies found on wafers is disclosed. Each wafer is part of a set of wafers and the sorting rejects some of the dies. The method first selects an acceptable deviation within an abstract distribution. A respective test parameter is measured and recorded for each die in the set of wafers, and a distribution of the test parameter across the set of wafers is calculated. Based on this distribution and the acceptable deviation, a test parameter limit is set and any dies having a test parameter value greater than the limit are rejected.

13 Claims, 6 Drawing Sheets

REAL TIME QUIESCENT CURRENT TEST LIMIT METHODOLOGY

BACKGROUND OF THE INVENTION

The present invention relates to sorting integrated circuit dice created on wafers. In particular, the present invention relates to setting limits for acceptable quiescent currents on a wafer lot basis or a wafer basis to sort and reject dice.

Integrated circuits are typically produced on large circular wafers of silicon. Each wafer is divided into a matrix of dice or chips with each die containing one complete integrated circuit. The wafers are produced in a batch process such that each wafer is associated with a wafer lot typically containing 24–48 wafers.

The production techniques used to produce the dice are not perfect and thus some dice are defective. To avoid shipping defective dice to customers, the dice are tested. One series of tests, known as wafer sort, is performed after the circuits have been completely formed on the wafer but before the individual dice have been packaged for shipment. A second series of tests is performed after the individual dice have been assembled into die packages that are later used to connect the dice to other circuit elements. This final series of tests is known as final test.

One type of test that is performed during both wafer sort and final test is known as a quiescent current test. The quiescent current test measures the amount of current drawn through the power inputs of each die while the inputs of each die are placed in a state that turns off all of the active devices in the die. In the past, quiescent current testing was performed by setting an acceptable quiescent current test limit based upon the dice circuit design. In the prior art, any dice with a quiescent current above the test limit were rejected. This quiescent current test limit was set once and was not changed until the circuit design changed.

This fixed limit has generally been set to maximize the number of dice that are shipped for each wafer lot. However, this yield maximization ignores differences between dice in a lot. Thus, even though all of the dice that are shipped are operational at ship time, there may be some dice that are substantially different from the remaining dice in their respective lots.

The present invention recognizes that these substantially different dice, even though operational at ship time, are likely to fail or cause other problems after being shipped. Such "maverick" or abnormal dice could be rejected before shipment by lowering the fixed quiescent current limit. However, lowering the limit results in a significant decrease in yield since the lower limit causes large numbers of non-maverick dice to be rejected from some lots. Thus, a new method for determining a quiescent current test limit is needed to avoid shipping dice with abnormal quiescent currents.

BRIEF SUMMARY OF THE INVENTION

The present invention is a method and system for sorting dice where each die is formed on a wafer and each wafer is part of a wafer lot. The first step of the method is to select an acceptable amount of variation between dice in a lot. A test parameter is then measured and recorded for dice in a lot. The distribution of the test parameter across the dice in the lot is determined. The distribution is combined with the acceptable amount of variation to set a lot specific test parameter limit. All dice in the lot with a test parameter value beyond the test parameter limit are rejected.

In preferred embodiments, the method of sorting dice is performed both at wafer sort and at final test. During wafer sort, the quiescent currents of all of the dice in the lot are measured to determine the mean of the quiescent currents. Based on the mean and the acceptable deviation from the mean, a quiescent current limit can be set. At final test, the quiescent current from a statistically significant number of dice is measured to determine the mean and distribution of quiescent currents. From this distribution and the acceptable deviation from the mean, a new quiescent current limit is derived. The quiescent current limit of the final test and the quiescent current limit of the wafer sort can be different since some of the dice present at wafer sort are removed before final test.

DETAILED DESCRIPTION OF THE PREFERRED EMBODIMENTS

Figures 1, 2:
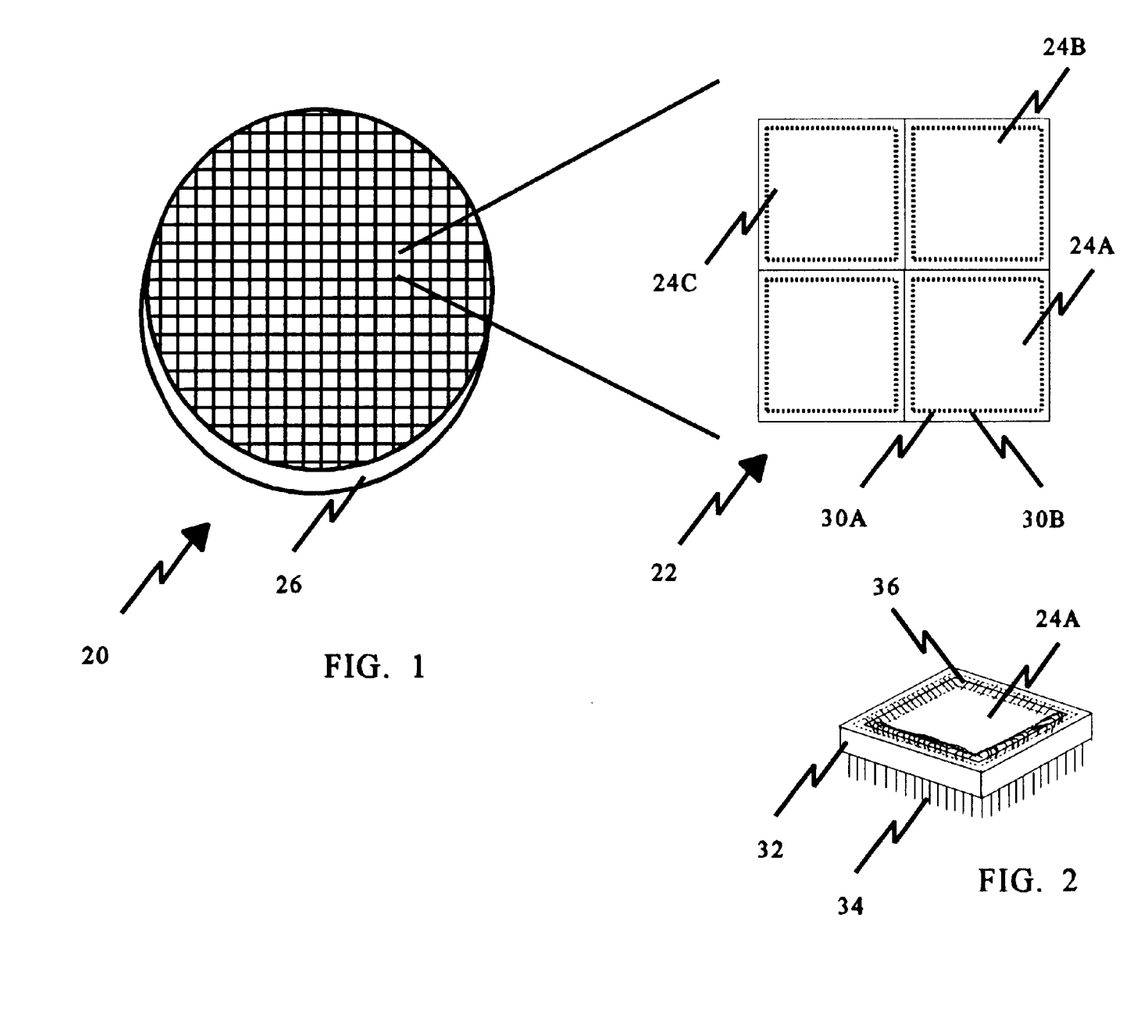
FIG. 1 is a diagram of a wafer containing a plurality of dice.
FIG. 2 is a diagram of a packaged die.

FIG. 1 is a diagram of a wafer 20 with a wafer portion 22 shown in exploded form. As shown in the exploded form of wafer portion 22, wafer 20 consists of a matrix of dice such as dice 24A, 24B, and 24C. Each of the dice consists of circuit components and conductive traces (not shown) that have been deposited on or diffused into a silicon substrate 26, which forms the bulk of wafer 20. Each die has bond pads such as bond pads 30A and 30B of die 24A. A series of bond pads generally extends around the perimeter of the dice and each bond pad is a relatively large conductive surface that connects to conductive traces within a die. The bond pads permit input and power signals to be delivered to the dice and permit output signals to be delivered from the dice to external circuits.

After being cut from the wafer, the dice are connected to external circuits through a package such as package 32 of FIG. 2. Package 32 contains pins 34 that can be soldered to a circuit board to make connections with other circuit components. In FIG. 2, package 32 is connected to die 24A through conductors 36, which are bonded to the die pads of die 24A and to pins 34 of package 32.

Each wafer 20 is associated with a wafer lot that typically contains 24 to 48 wafers. A wafer lot generally contains wafers that are processed in the same wafer "boat" or carrier. Since these wafers have been processed at the same time, they have been exposed to the same levels of dopants and etchants and thus have similar physical and performance characteristics. The similarity in the characteristics of dice within a lot creates a distribution of dice that is unique to each lot. Thus, a first wafer lot will have average die characteristics that are different from the average die characteristics of a second wafer lot.

Figure 3A:
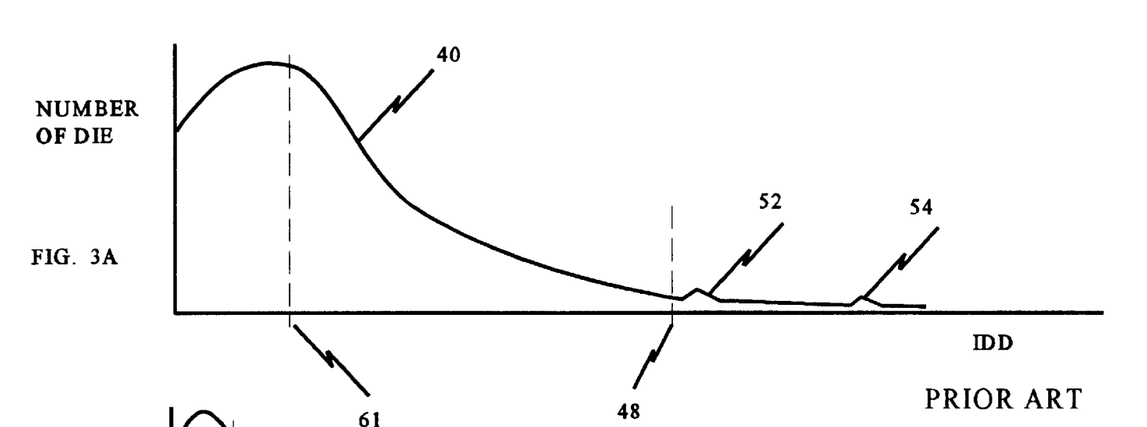
FIG. 3A is a diagram of a quiescent current distribution for a first wafer lot, with a current limit of the prior art.
Figure 3B:
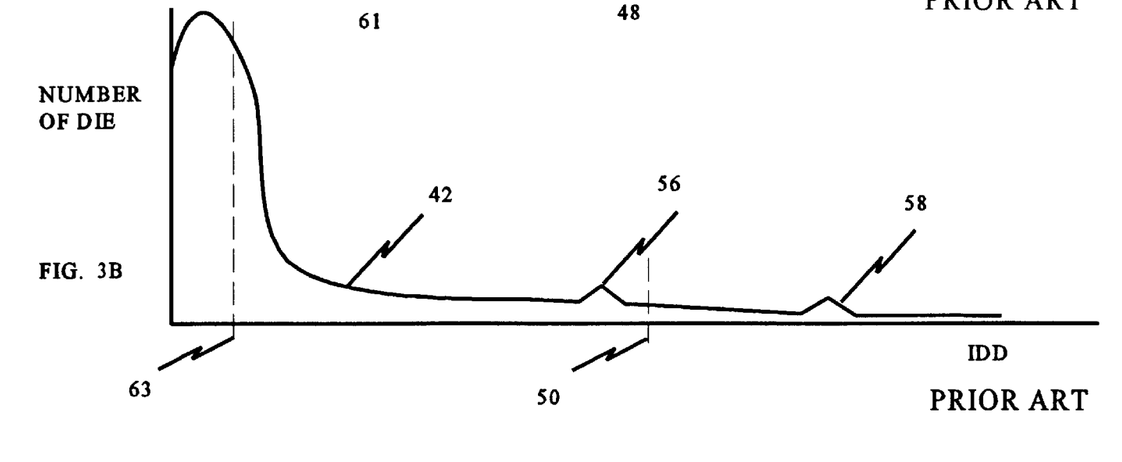
FIG. 3B is a diagram of a quiescent current distribution for a second wafer lot, with a current limit of the prior art.

FIGS. 3A and 3B show distributions of a specific die characteristic for dice in a first and second wafer lot, respectively. In particular, FIGS. 3A and 3B depict the distribution of a quiescent current, IDD, across a first and second wafer lot. As mentioned above, the quiescent current, IDD, is a measure of the current drawn through the power inputs of the die when the other inputs of the die are fixed so that all of the active devices, such as transistors, are off.

FIGS. 3A and 3B are aligned such that the values of the quiescent current, IDD, shown along the respective horizontal axis of both FIG. 3A and FIG. 3B, are aligned. Thus, a vertical line crossing both the horizontal axis of FIG. 3A and the horizontal axis of FIG. 3B represents a single value for the quiescent current, IDD. The vertical axis of FIG. 3A is measured in units of dice in the first wafer lot and the vertical axis of FIG. 3B is measured in units of dice in the second wafer lot. Graph 40 of FIG. 3A shows a distribution of dice in the first wafer lot in terms of quiescent current, IDD. Graph 42 of FIG. 3B shows a distribution of dice for the second wafer lot.

Graphs 40 and 42 have similar shapes, which can be modeled as a normal distribution, also known as a Gaussian distribution. Each graph has its maximum at a quiescent current that is greater than zero and after the maximum, each graph trails off in a generally bell-shaped fashion as the quiescent current increases. Graphs 40 and 42 are not identical; for instance, graph 40 shows a flatter distribution of quiescent currents than graph 42. Some of the differences between graph 40 and graph 42 may be caused by a greater similarity between the dice of the wafer lot associated with graph 42 than between the dice of the wafer lot associated with graph 40. Other differences between the graphs may be caused by differences in the mean quiescent current of the different wafer lots. For instance, graph 40 has a mean 61 that is larger than mean 63 of graph 42.

To eliminate unacceptable dice from a wafer lot, the dice are sorted. One sorting method uses the quiescent current to determine which dice should be rejected and which dice can be shipped. In the prior art, a fixed limit for the quiescent current was set when the die was designed. Such a fixed limit is shown in FIGS. 3A and 3B as fixed limit 48 and fixed limit 50, respectively. Fixed limits 48 and 50 represent the same quiescent current in FIGS. 3A and 3B.

Graph 40 includes two anomalous peaks 52 and 54. These peaks represent an unusually large number of dice that have a quiescent current that is substantially different from the mean quiescent current. Graph 42 of FIG. 3B similarly contains two anomalous peaks 56 and 58. Note that prior art fixed limit 48 of FIG. 3A excludes the dice found in both anomalous peak 52 and anomalous peak 54. However, prior art fixed limit 50 of FIG. 3B, which is at the same quiescent current as fixed limit 48 of FIG. 3A, allows the dice of anomalous peak 56 to pass to the customer.

Figure 3C:
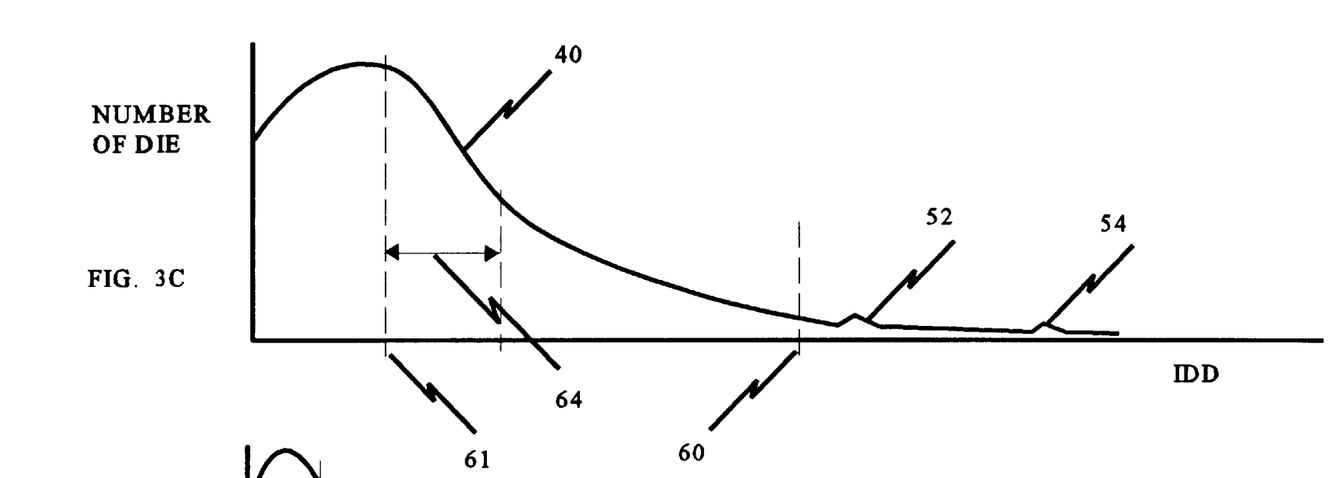
FIG. 3C is a diagram of the current distribution of FIG. 3A with a current limit of the present invention.
Figure 3D:
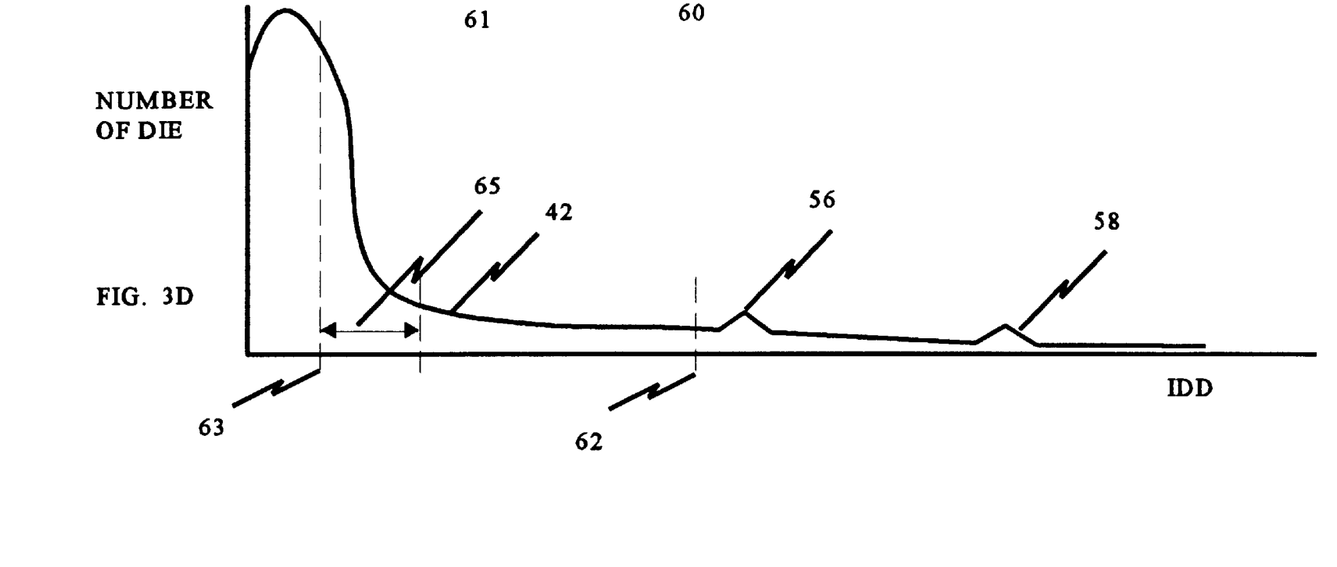
FIG. 3D is a diagram of the current distribution of FIG. 3B with a current limit of the present invention.

To avoid this result, which the present inventors have determined is undesirable, the present invention creates quiescent current limits based upon the quiescent current distribution of the dice found in each wafer lot. FIG. 3C, which shows the same quiescent current distribution graph 40 as shown in FIG. 3A, also shows the present invention's quiescent current limit 60. This current limit is based on the distribution of quiescent currents across the wafer lot and is derived through a method discussed further below. FIG. 3D shows the same quiescent current distribution graph 42 as shown in FIG. 3B and shows the present invention's quiescent current limit 62, which is based on the quiescent current distribution in the second wafer lot.

Since both quiescent current limit 60 and quiescent current limit 62 are based upon the distribution of quiescent currents, the quiescent current limits of the present invention are able to exclude abnormal dice. In particular, it is noted that quiescent current limit 60 of FIG. 3C excludes both peak 52 and peak 54 of graph 40 and that quiescent current limit 62 of FIG. 3D excludes both peak 56 and peak 58 of graph 42.

In an embodiment shown in FIGS. 3C and 3D, quiescent current limit 60 and quiescent current limit 62 are based on the mean and standard deviation of graphs 40 and 42, respectively, and on an acceptable deviation or variation chosen before testing begins. Mean 61 and mean 63 of graphs 40 and 42, respectively, are calculated using the following formula:

$$\overline{Q} = \frac{\sum Q_j}{N} \qquad \text{Eq. (1)}$$

Where $Q_j$ is the quiescent current for the jth die, N is the total number of dice, and $\overline{Q}$ is the mean quiescent current.

Standard deviation 64 and standard deviation 65 of graphs 40 and 42, respectively, are calculated using the following formula:

$$\sigma = \sqrt{\frac{\sum (Q_j - \overline{Q})^2}{N}} \qquad \text{Eq. (2)}$$

where $Q_j$ is the quiescent current of the jth die, $\overline{Q}$ is the mean quiescent current, N is the number of dice, and $\sigma$ is the standard deviation.

Once the mean and standard deviation have been determined, the acceptable deviation is multiplied by the standard deviation and the product of that multiplication is added to the mean to produce the quiescent current limit. For instance, if the acceptable deviation is chosen as three standard deviations, or $3\sigma$, as shown in FIGS. 3C and 3D, then the standard deviation calculated in Equation 2 is multiplied by three and added to the mean calculated in Equation 1 and the result is the present invention's quiescent current limit.

The Gaussian model selected above is not the only distribution model that can be used with the present invention. For instance, chi-square and Weibull distribution models may be used instead of the Gaussian distribution model if these other models better fit the recorded quiescent current distribution. Regardless of the selected model, the mean and variance of the distribution can be determined by using equations appropriate to the chosen distribution. Although not repeated in this application, these equations are available in most statistical books and are readily understandable to those skilled in the art. An acceptable number of variances is selected and combined with the calculated mean and variance to determine a quiescent current limit in a manner similar to the method described above for a Gaussian distribution model.

Figure 4:
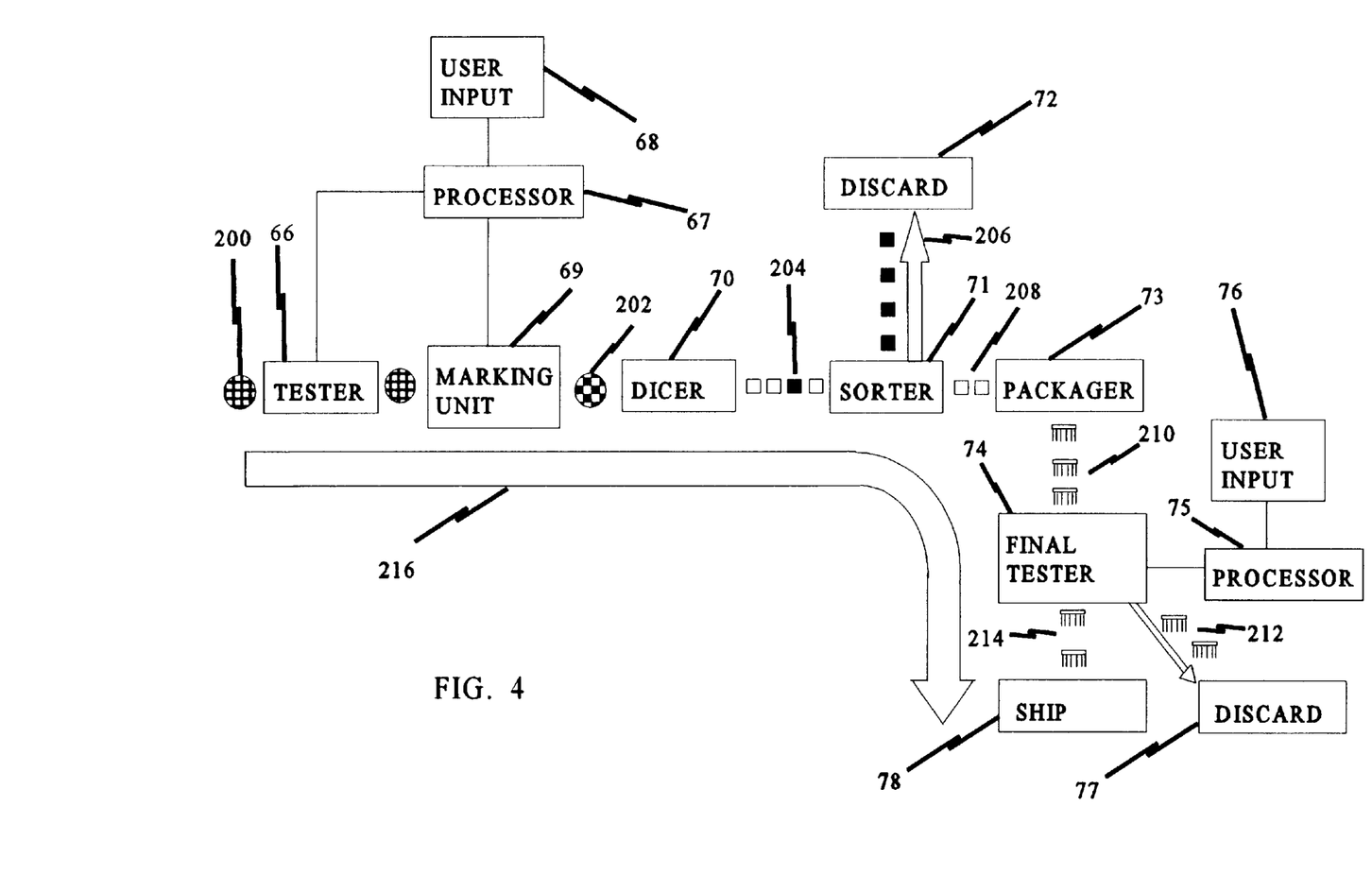
FIG. 4 is a block diagram of a system for sorting dice on a process line of the present invention.

FIG. 4 is a system for manufacturing dice on a process line of the present invention. Wafers 200 move along a process line in a direction 216. As they approach the process line of FIG. 4, wafers 200 contain dice as shown in FIG. 1.

Wafers 200 are placed in a first tester 66, which tests the dice found on each wafer to determine, among other things, the quiescent current of each die. The quiescent current measured by first tester 66 is recorded in a memory space allocated for processor 67, which is connected to first tester 66. In a preferred embodiment, after an entire lot has been tested, processor 67 accesses the stored quiescent current values and determines a distribution of quiescent current values. In preferred embodiments, processor 67 uses Equations 1 and 2 to determine the mean and standard deviation of the distribution for each wafer lot. Processor 67 also receives an acceptable deviation from user input 68. Processor 67 uses the acceptable deviation and the calculated mean and standard deviation to set a quiescent current limit. After calculating the quiescent current limit, processor 67 compares each of the recorded quiescent currents against the limit. Based on this comparison, processor 67 issues commands to marking unit 69, which receives the wafers after they have passed through first tester 66. Marking unit 69 marks those dice that processor 67 indicates have a quiescent current greater than the quiescent current limit. In preferred embodiments, the marking is accomplished by placing ink on each of the dice to be rejected. After the marking is completed, marking unit 69 passes the marked wafers 202 to dicer 70.

Dicer 70 slices marked wafers 202 into individual dice 204 which are passed to sorter 71. Sorter 71 creates two output streams. The first output stream, rejection stream 206, contains marked dice and is delivered to a discard pile 72. The second output stream is unmarked dice 208 which are delivered to packager 73. Packager 73 places the unmarked dice in circuit board packages such as the one shown in FIG. 2, producing packaged dice 210.

Packaged dice 210 are received by final tester 74, which performs final tests on the packaged dice under the control of processor 75. One of the tests performed by final tester 74 is a quiescent current limit test. In the quiescent current limit test, final tester 74 measures the quiescent current of a sampling of packaged dice 210. These quiescent current measurements are delivered to processor 75, which determines a distribution for the quiescent currents. Based on this distribution and an acceptable deviation received by processor 75 from user input 76, processor 75 sets a final quiescent current limit. This final quiescent current limit may be different from the quiescent current limit set by processor 67.

After the final quiescent current limit has been set, final tester 74 measures the quiescent current in each packaged die 210 from a lot and compares the measured quiescent current against the quiescent current limit. Those packaged dice that have a quiescent current greater than the quiescent current limit are placed on a discard stream 212 that ends at a discard pile 77. The packaged dice that have a quiescent current that is less than the quiescent current limit are placed in a ship stream 214 and are shipped in box 78.

Figure 5:
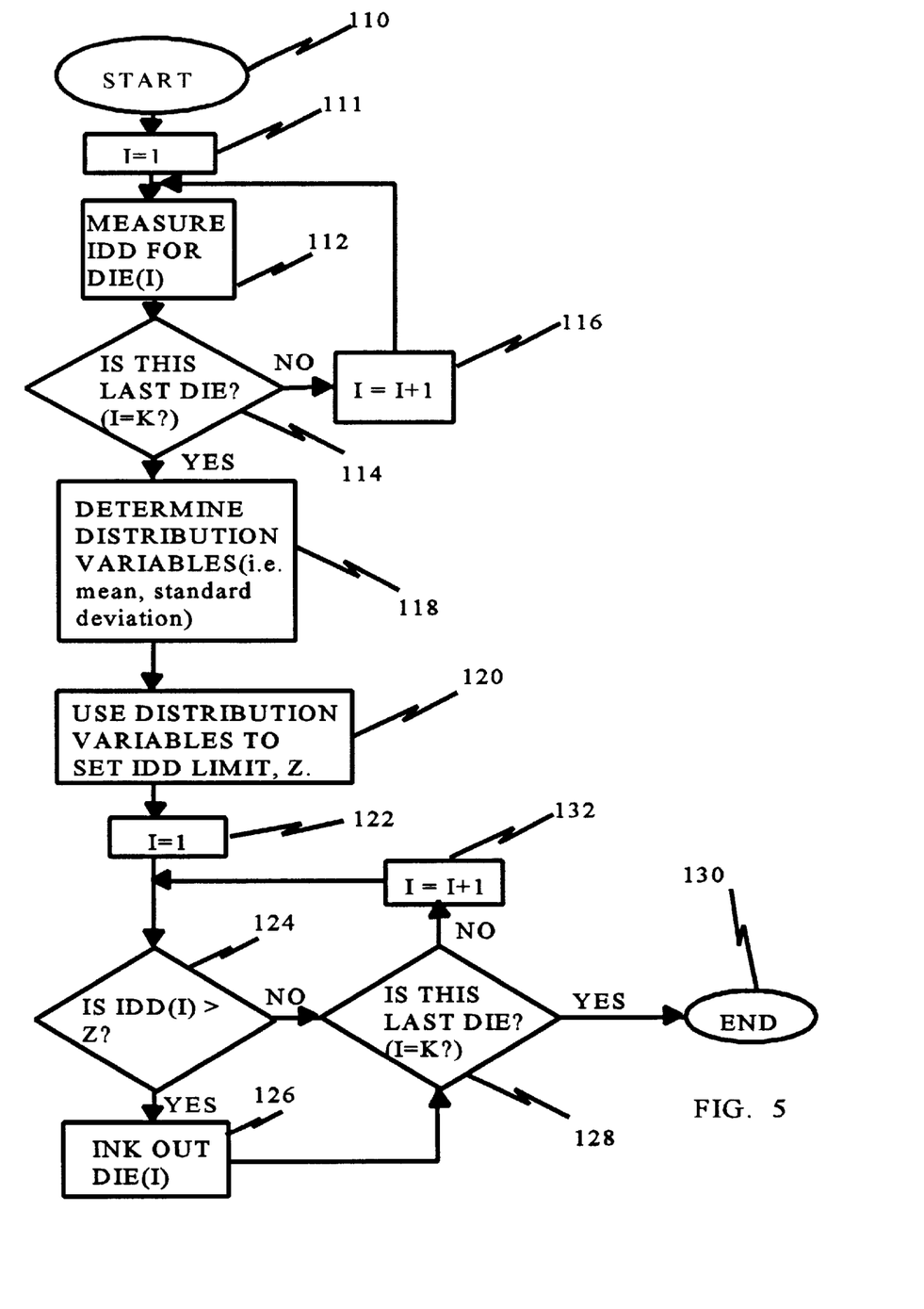
FIG. 5 is a flow diagram of a quiescent current sorting method at wafer sort for the present invention.

FIG. 5 is a flow diagram of the quiescent current test performed during wafer sort by first tester 66 of FIG. 4. The quiescent current test shown in FIG. 5 begins at start block 110. At block 111, a die counter variable, I, is set to one. Next, a single die, die (I), is tested in test block 112 for its quiescent current IDD, and this quiescent current is recorded. After the quiescent current is recorded, the value of I is compared to K, the number of dice in the lot, to determine if the last die tested was the last die in the wafer lot. This comparison is shown in decision box 114. If the current die is not the last die, the die counter variable, I, is incremented by one in action box 116 and the quiescent current of a new die (I) is tested in action box 112.

When the last die is reached in decision box 114, the process continues in action box 118 where distribution variables for the quiescent currents of all of the dice are determined. In one preferred embodiment, these distribution variables include the mean quiescent current and the standard deviation, which are calculated using equations 1 and 2 above, respectively. After the distribution variables have been determined, they are combined with an acceptable deviation to set a quiescent current limit, Z, in box 120.

With the quiescent current limit set, the quiescent current of each die is compared against the quiescent current limit, Z. Thus, in action box 122, the die counter variable, I, is reset to one. In decision box 124, the quiescent current of die (I) is compared against the quiescent current limit, Z. If the quiescent current of die (I) is greater than the quiescent current limit Z, die (I) is marked or "inked-out" in action box 126. After die (I) has been inked out or in the alternative, after it has been determined that the quiescent current of die (I) is less than the quiescent current limit, Z, the die counter variable, I, is compared against the total number of dice in the wafer lot, K, in decision box 128. If I is equal to K at decision box 128, the current die is the last die and the process ends at end box 130. If I is not equal to K, there are more dice left in the lot and the process continues at action box 132 where the die counter variable, I, is incremented by one. The process then returns to decision box 124.

After the process described by the flow diagram of FIG. 5 has been completed, dice with quiescent currents that are greater than the quiescent current limit have been marked or inked out. Dies with quiescent currents less than the current limit have not been marked or inked out. Since the quiescent current limit chosen in the process of FIG. 5 is determined based upon the distribution of quiescent currents for the dice in a particular lot, abnormal or "maverick" dice are eliminated without negatively impacting yield.

Figure 6:
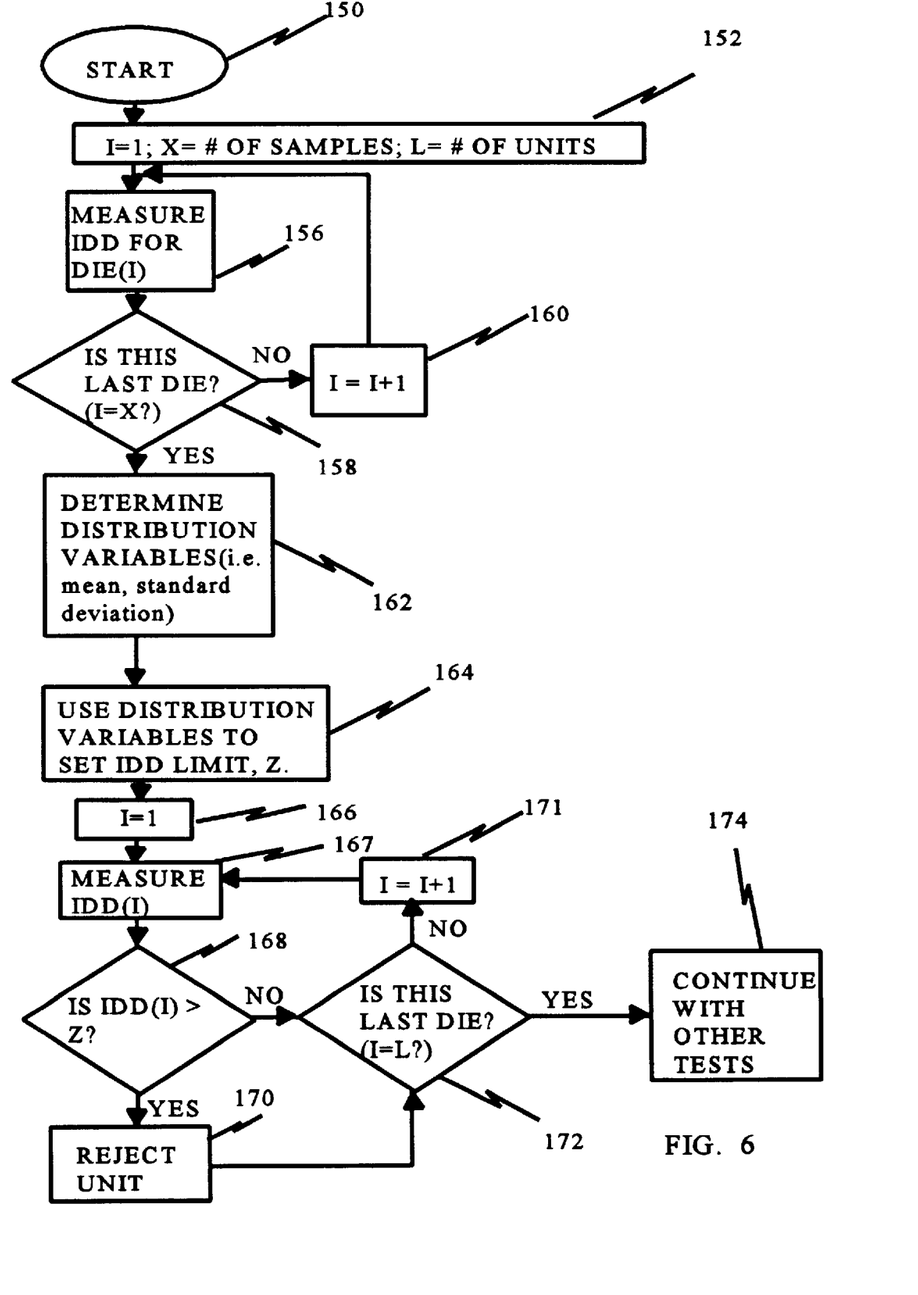
FIG. 6 is a flow diagram of a quiescent current sorting method at final test for the present invention.

FIG. 6 is a flow diagram of one portion of the final test procedure of the present invention. Beginning at start box 150 the process proceeds to action box 152 where a number, X, is selected that represents a statistically significant number of samples for determining a distribution of quiescent currents in the packaged dice. The number of samples selected should provide a distribution of quiescent currents that is representative of the quiescent current distribution for all of the remaining packaged dice, L, from the wafer lot. The remaining packaged dice, L, is equal to the number of dice originally in the lot less the number of dice that were rejected during wafer sort. After the number of samples, X, is determined, the test unit counter variable, I, is reset to one. After the test unit counter variable has been reset, the first test unit is tested to determine its quiescent current in action box 156. The quiescent current for this test unit is recorded for later use in determining a distribution.

In decision box 158, the value of the test unit counter variable, I, is compared with X, the number of samples that need to be taken. If the counter variable is less than X, the counter variable is incremented in action box 160 and a new die is tested in action box 156. After a quiescent current has been measured for X test units, distribution variables are determined for the quiescent currents of the samples in box 162. In preferred embodiments, these distribution variables include the mean and the size of a standard deviation. Based on the mean, the size of the standard deviation and an acceptable deviation, a new quiescent current limit, Z, is established in action box 164. The acceptable deviation used in the final test can, but does not need to equal the acceptable deviation used in wafer sort. Thus, at wafer sort the acceptable deviation may be $3\sigma$ or 3 standard deviations, but at final test the acceptable deviation may be reduced to $2\sigma$.

Once the quiescent current limit is set, the test unit counter variable, I, is reset to one in action box 166 and the quiescent current for test unit (I) is measured in action box 167. The measured quiescent current is then compared against the quiescent current limit, Z, in decision box 168. If the quiescent current of the test unit is greater than the quiescent current limit, the test unit is rejected in action box 170. If the quiescent current is not greater than the quiescent current limit or in the alternative, if the test unit has been rejected in action box 170, the test unit counter variable, I, is compared against L, the number of units in final test. In decision box 172, if the test unit counter variable is equal to L, the test unit is the last test unit and the remaining tests to be performed in final test may proceed in action box 174. If the current test unit is not the last test unit to be tested, the test unit variable counter, I, is incremented in action box 171 and the next test unit to be tested has its quiescent current read in action box 167.

Although the distribution variables used in the methods described above have included the mean and the standard deviation of the distributions, those skilled in the art will recognize that other variables may be used to describe the distribution and the acceptable amount of variation in the distribution.

Although the present invention has been described with reference to preferred embodiments, workers skilled in the art will recognize that changes may be made in form and detail without departing from the spirit and scope of the invention.

What is claimed is:

1. A method of sorting dice, each die formed on a wafer, a plurality of wafers forming a wafer lot, the sorting rejecting some of the dice, the method comprising:

selecting a first deviation in terms of standard deviations from a selected mean;

measuring and recording a respective quiescent current drawn by each die in the wafer lot;

calculating a measured statistical mean and a measured standard deviation of the quiescent currents for the dice in the wafer lot;

setting a wafer lot specific quiescent current limit by multiplying the measured standard deviation by the first deviation to obtain a product and adding the product to the measured statistical mean; and rejecting the dice that have a quiescent current greater than the wafer lot specific quiescent current limit.

2. The method of claim 1 wherein the measured statistical mean and the measured standard deviation are calculated based upon the quiescent current of all the dice in the wafer lot.

3. The method of claim 1 wherein the measured statistical mean and the measured standard deviation are calculated based upon the quiescent currents of fewer than all of the dice in the wafer lot.

4. The method of claim 1 wherein a first die in a first wafer lot has a first quiescent current that is less than the quiescent current limit for the first wafer lot but greater than the quiescent current limit for a second wafer lot, the first die not being rejected.

5. The method of claim 1 wherein the sorting is performed after the dice are formed on the wafer but before the dice are cut from the wafer.

6. The method of claim 1 wherein the sorting is performed after the dice are inserted in packages.

7. A method of manufacturing dice, the method comprising:

determining a first amount of variation between the dice in a wafer lot for a selected parameter;

forming the dice on a wafer, a plurality of wafers forming the wafer lot, with each wafer in the wafer lot proximate to all other wafers in the wafer lot;

measuring the selected parameter of the dice in the wafer lot to produce a plurality of measured test parameter values;

calculating a distribution of the measured test parameter values for the wafer lot;

setting a test parameter limit for the selected parameter based on the distribution of the measured test parameter values and the first amount of variation for the selected parameter; and designating the dice that have a test parameter value greater than the test parameter limit as rejected dice.

8. The method of claim 7 wherein the selected parameter is a quiescent current.

9. The method of claim 7 wherein the first amount of variation is set as a number of standard deviations from the selected mean, and the distribution is calculated as a statistical mean and the size of a standard deviation in terms of test parameter values from the statistical mean.

10. The method of claim 7 further comprising:

determining a second amount of variation between the dice in the wafer lot for the selected parameter after determining the first amount of variation between the dice in the wafer lot for the selected parameter and before forming the dice on the wafers;

cutting the wafers into individual cut die after designating the dice that have a test parameter value greater than the test parameter limit as rejected dice;

discarding the rejected dice;

packaging the dice that were not rejected, the packaging forming packaged dice;

measuring the selected parameter in fewer than all of the packaged dice to produce a sampling of packaged test parameter values;

calculating a packaged distribution of the packaged test parameter values from the sampling of packaged test parameter values;

setting a packaged test parameter limit based on the packaged distribution of the packaged test parameter values and the second amount of variation between the dice;

measuring the selected parameter of each of the packaged dice to produce final packaged test parameter values; and rejecting the packaged dice with final packaged test parameter values greater than the packaged test parameter limit.

11. The method of claim 10 wherein the selected parameter is a quiescent current.

12. The method of claim 10 wherein the first amount of variation is different from the second amount of variation.

13. The method of claim 10 wherein the second amount of variation is set as a number of standard deviations from a selected mean, and the packaged distribution is calculated as a statistical mean and the size of a standard deviation in terms of the packaged test parameter values from the statistical mean.

* * * * *